United States Patent
Sato (10) Patent No.: US 7,119,622 B2
(45) Date of Patent: Oct. 10, 2006

(54) AMPLIFICATION DEVICE WITH A BIAS CIRCUIT

(75) Inventor: Masaharu Sato, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 160 days.

(21) Appl. No.: 11/006,970

(22) Filed: Dec. 8, 2004

(65) Prior Publication Data

US 2005/0134384 A1    Jun. 23, 2005

(30) Foreign Application Priority Data

Dec. 18, 2003   (JP)   ............................. 2003-421160

(51) Int. Cl.
    *H03F 3/16*   (2006.01)
(52) U.S. Cl. ..................................... 330/296
(58) Field of Classification Search ................. 330/296
    See application file for complete search history.

(56) References Cited

U.S. PATENT DOCUMENTS 5,777,518 A * 7/1998 Bailey .......................... 330/296

6,714,081 B1 * 3/2004 Xu .............................. 330/296

FOREIGN PATENT DOCUMENTS

JP              01256205 A      12/1989

* cited by examiner

*Primary Examiner*—Steven J. Mottola
(74) *Attorney, Agent, or Firm*—Akin Gump Strauss Hauer & Feld, LLP (57) ABSTRACT

An operational amplifier amplifies a signal received through its input terminal connected directly to a piezoelectric device. A bias voltage generating section includes a voltage divider between the power supply terminal and the ground terminal. The drain and source of a p-channel MOSFET are connected to the input terminal of the operational amplifier and the ground terminal. Since the voltage divider applies a bias voltage to the gate and the backgate, the p-channel MOSFET maintains the OFF state. Since a drain-backgate parasitic diode clamps the drain potential to the bias voltage, the bias voltage is applied to the input terminal of the operational amplifier. Then, the drain-backgate resistance is extremely high. The p-channel MOSFET is embedded on a substrate together with other circuits of the amplification device. Thus, the amplification device with an extremely high input impedance is configured as a single integrated circuit.

5 Claims, 8 Drawing Sheets

AMPLIFICATION DEVICE WITH A BIAS CIRCUIT

BACKGROUND OF THE INVENTION

This invention relates to amplification devices, in particular, amplification devices connected to signal sources with high internal impedances.

Vibration sensors are sensors for detecting forces exerted on an object to be measured, in other words, for detecting accelerations of the object, and for converting the magnitudes of the forces into electric signals. The range of uses of vibration sensors is wide, which include, for example: monitoring of abnormal vibration in motors etc.; control of a balance of lathe etc.; monitoring of conditions of air conditioners etc.; measurements of characteristics of HDDs etc.; medical diagnoses and treatments using ultrasonically vibration etc.; hand movement detection for digital video cameras etc.; and sound detection for cellular phones etc. In many of those uses, both of miniaturization and high reliability are demanded of vibration sensors.

The vibration sensors of miniature size widely used in general are of the piezoelectric types, which use piezoelectric devices. In addition, especially as sound sensors, capacitive microphones such as electret condenser microphones (ECM) are frequently used. Such vibration sensors, in general, have high internal impedances, which are determined mainly by their capacitive reactance components; for example, a piezoelectric device has an equivalent capacitance within the range from several picofarads to several tens of picofarads, in general. Therefore, the internal impedances are especially high in the low frequencies.

Figure 7:
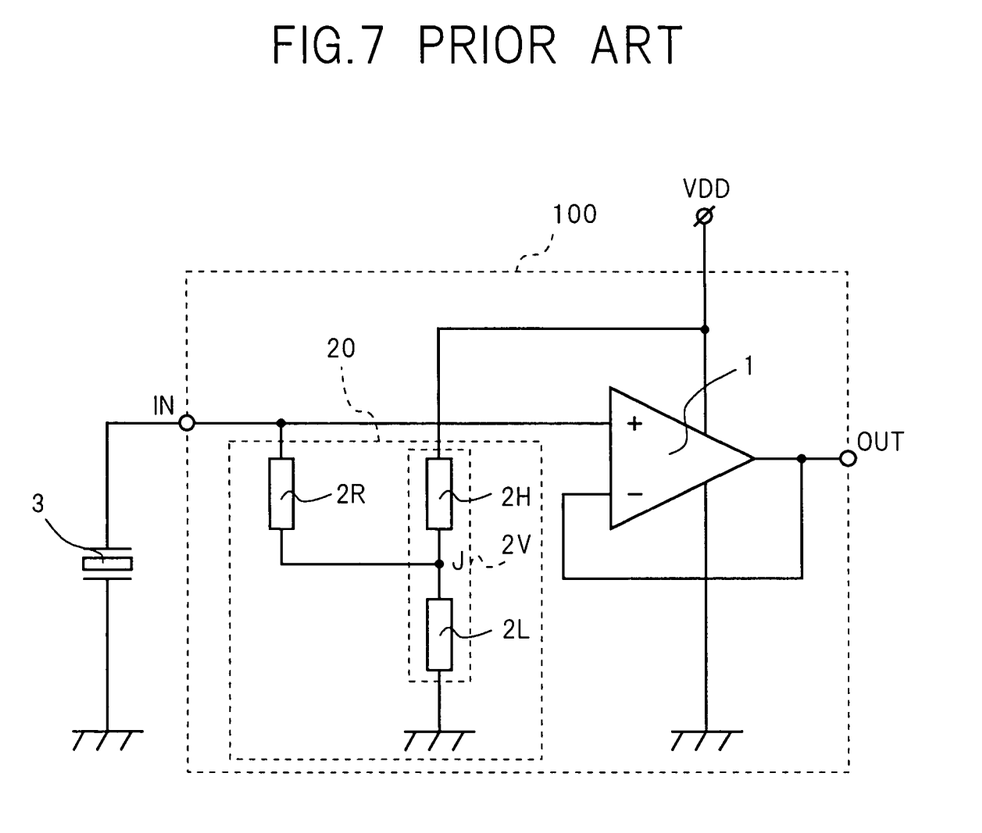
FIG. 7 is the equivalent circuit diagram that shows the conventional amplification device 100.

The output signals of vibration sensors are amplified at a rate within the range from a few tens to several hundreds of times, in many cases. Furthermore, for uses of vibration sensors with particular emphasis on the low frequencies of the output signals such as sound detection, in general, the lower limit of the frequencies of the output signals to be amplified is usually set at the order of 10 Hz. For such amplifications, in general, multistage amplification devices are widely used. In particular, the first stage of the amplification device is connected directly to a vibration sensor. The first stage of the amplification device requires a high input impedance, when the vibration sensor has a high internal impedance. In an amplification device with a high input impedance, its bias circuit requires some contrivance. In a conventional amplification device 100 connected to a piezoelectric vibration sensor acting as a signal source, for example, a bias circuit 20 is configured as follows. See FIG. 7. In this bias circuit 20, two resistors 2H and 2L are connected in series between a power supply terminal VDD and a ground terminal, thereby constituting a voltage divider. The node J between the two resistors 2H and 2L, that is, the output terminal J of the voltage divider 2V is connected through a third resistor 2R to an input terminal IN of the operational amplifier 1. The resistance value of the third resistor 2R is set at a value far higher than any of the resistance values of the two resistors 2H and 2L. Furthermore, the operational amplifier 1 has a high input impedance because of its MOSFET input stage. Accordingly, direct currents hardly flow in the third resistor 2R, and thus, voltage drops hardly occur across the third resistor 2R. Therefore, the potential of the output terminal J of the voltage divider 2V is applied to the input terminal IN of the operational amplifier 1 for use as a bias voltage. Thereby, the output terminal OUT of the operational amplifier 1 is maintained at a potential a predetermined-ratio times as high as the potential of the input terminal IN. In FIG. 7, the potential of the output terminal OUT is equal to the potential of the input terminal IN, since the operational amplifier 1 is of a voltage-follower type.

Figure 8:
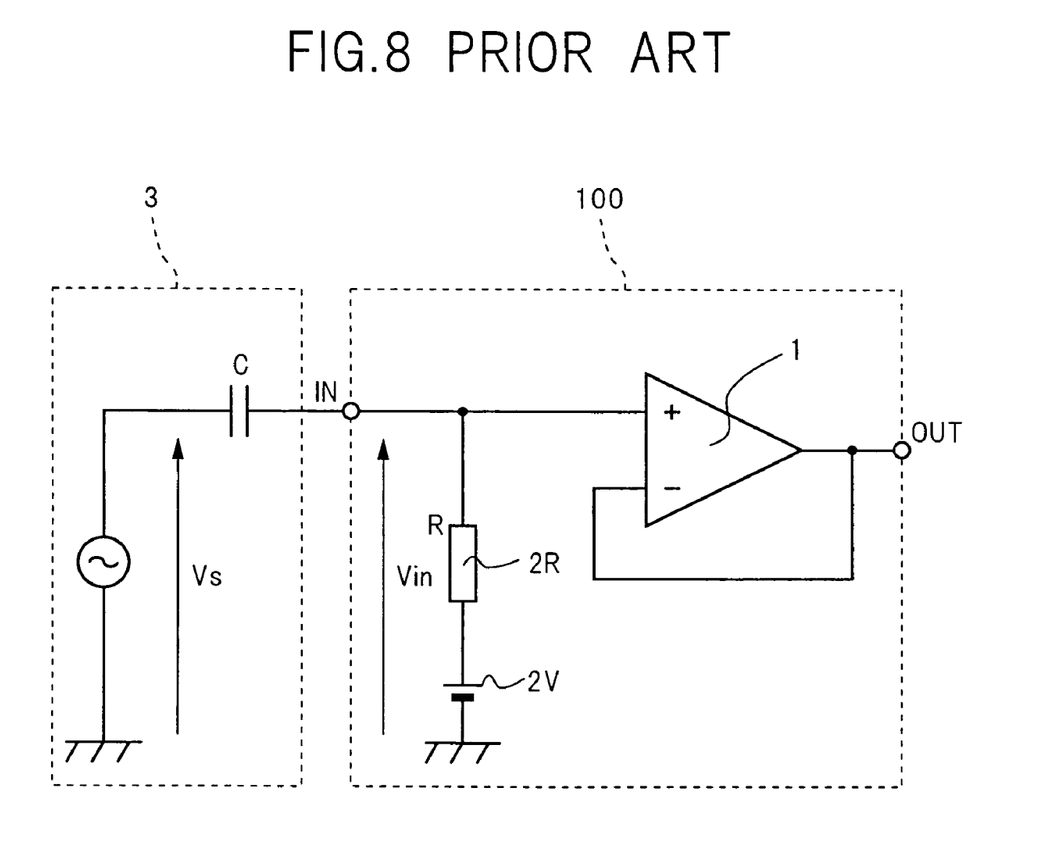
FIG. 8 is the equivalent circuit diagram that shows the piezoelectric device 3 and the conventional amplification device 100 for the output signal Vs of the piezoelectric device 3.

Especially for the alternating signals provided from the piezoelectric device 3, the voltage divider 2V acts as a constant voltage source. See FIG. 8. The internal impedance Z of the piezoelectric device 3 is determined mainly by its capacitive reactance component. Actually, the internal impedance Z is expressed by the following equation:

$$Z=1/(2\pi fC),$$

where C and f represent the equivalent capacitance and output frequency of the piezoelectric device 3, respectively. Furthermore, the level Vin of the input signal of the operational amplifier 1 is lower than the level Vs of the output signal of the piezoelectric device 3 by a predetermined coefficient. The coefficient depends on the equivalent capacitance C and output frequency f of the piezoelectric device 3 and the resistance value R of the third resistor 2R. In particular, the coefficient decreases with decrease of the output frequency f since the internal impedance of the piezoelectric device 3 increases. Accordingly, the amplification device 100 offers a lower gain. For example, when the output frequency f is equal to the threshold value f0=1/(2πRC), the level Vin of the input signal of the operational amplifier 1 is lower by 3 dB than the level Vs of the output signal of the piezoelectric device 3.

It is desirable to reduce the threshold value f0 for the output frequency f of the piezoelectric device 3 as much as possible in order to maintain the gain of the amplification device 100 high enough even in low frequencies. This requires the product of the resistance value R of the third resistor 2R and the equivalent capacitance C of the piezoelectric device 3 to be large enough. For example, when the equivalent capacitance C of the piezoelectric device 3 is of the order of 10 pF, the resistance value R of the third resistor 2R is required to be 1.6 GΩ or more for the 10 Hz or less threshold value f0 of the output frequency f.

It is desirable for miniaturization that the amplification device 100 is configured as a single integrated circuit. In that case, however, the third resistor 2R must be added externally as a discrete element separate from the other elements. There is an upper limit for sheet resistances, which is usually of a few tens of kilo ohms, due to a limit of control over impurity concentration. If a resistance element of 1.6 GΩ were configured in the region with a sheet resistance of 10 GΩ, for example, the aspect ratio L/W (the ratio of the length L to width W of the pattern) of the resistance element would reach 160,000. In other words, the length L would reach 160 mm even if the width W were 1 μm. Embedded resistance element of such a huge size would not be realistic. Accordingly, the third resistor 2R cannot be embedded at least on the substrate where the other elements inside the amplification device 100 are embedded. Therefore, for the conventional amplification device 100, miniaturization by further higher integration is difficult.

Integrated circuits are susceptible to adverse influences of the surrounding electrostatic discharge (ESD) through terminals connected to the outside. ESD protection circuits are, in general, provided around the pads for the purpose of the protection against the adverse effects of ESD, especially the prevention of the element destruction. The ESD protection circuits include diodes or transistors. The diodes and transistors are maintained in the OFF states under normal conditions, and on the other hand, turned on at the occurrence of an ESD surge, then connecting the pads to the ground or the power supply. Since the surge energy is absorbed into the ground conductor or the power supply, the adverse effect of the surge on the other elements is avoided.

The ESD protection circuit mounted on the substrate includes a reverse-biased PN junction. The PN junction of a larger area has a larger capacity for the surge currents, and thus provides higher reliability for the ESD protection circuit. However, a minute leak current flows in the reverse-biased PN junction. The leak current increases in proportion to the PN junction area, and in addition, drastically increases with temperature rise; for example, the amount of the leak current increases by nearly one order of magnitude for every 25 to 30 degree in temperature. In a thermal design for a semiconductor integration circuit, for example, heat generation of amplification devices or the like is considered, and accordingly, the guaranteed maximum value of the substrate temperature is set at a value, usually 125° C. or 150° C., sufficiently higher than the upper limit of a desired, guaranteed temperature range, usually of the order of 75 to 80° C. When the substrate temperature rises from 25° C. to 125° C., for example, the leak current increases by 1,000–10,000 times. In a PN junction designed for a area practical for an ESD protection device, the amount of the leak current is of the order of 10 pA at normal temperatures, and reaches 100 nA at approximately 125° C. When the leak current flows in the third resistor 2R, a voltage drop occurs. In the case of the resistance value of the third resistor 2R is 1.6 GΩ, the voltage drop reaches 16 V even if the amount of the leak current is 10 nA. On the other hand, a line voltage used for a miniature vibration sensor is restricted usually to 5V or less, and hence, the upper limit of the input dynamic range of the amplification device 100 is restricted to the order of 5V. Accordingly, the variation of the bias voltage due to the above-described voltage drop is excessive for the input dynamic range of the amplification device 100. Such an excessive variation of the bias voltage is undesirable since it can interfere with the operation of the amplification device 100, and further, it can cause the potential of the output terminal OUT of the amplification device 100, that is, the bias voltage for the next-stage amplification device to vary excessively. Accordingly, severe restrictions can be imposed on the design of the following amplification devices. Therefore, it is difficult to further improve the reliability of the whole of the multistage amplification device.

SUMMARY OF THE INVENTION

An object of the present invention is to provide an amplification device wherein the whole of a bias circuit and an amplifier circuit is embedded on the same substrate with any of an extremely high input impedance, a high ESD tolerance, and a highly stable bias voltage maintained, thereby achieving the compatibility between further higher integration and further improvement in high reliability.

An amplification device according to the invention comprises:
 a substrate;
 a high side power supply terminal connected to an external constant-voltage source and maintained at a fixed high potential;
 a low side power supply terminal connected to one of an external constant-voltage source and a ground conductor, and maintained at a fixed low potential;
 an amplifier circuit with a MOSFET input stage that includes an input terminal connected to an external signal source, is embedded on the substrate, receives a signal of the signal source through the input terminal, and amplifies the signal at a predetermined rate; and
 a bias circuit embedded on the substrate and comprising:
  a bias voltage generating section that generates a predetermined bias voltage; and
  a MOSFET acting as an impedance device including
   a drain and a source, the one of which is connected to one of the high and low side power supply terminals, and the other is connected to the input terminal of the amplifier circuit,
   a gate maintained at the potential to prohibit the channel generation between the drain and the source, and
   a backgate electrically separated from the substrate and maintained at the potential equal to the bias voltage.

The above-described MOSFET preferably includes the following p-channel MOSFET:
 the above-described drain and source are the drain and source of the p-channel MOSFET and are connected to the input terminal of the amplifier circuit and the low side power supply terminal, respectively; and
 the above-described gate is the gate of the p-channel MOSFET and is connected to one of the bias voltage generating section and the input terminal of the amplifier circuit.

The above-described MOSFET according to the invention may include the following n-channel MOSFET:
 the above-described drain and source are the drain and source of the n-channel MOSFET and are connected to the input terminal of the amplifier circuit and the high side power supply terminal, respectively; and
 the above-described gate is the gate of the n-channel MOSFET and is connected to one of the bias voltage generating section and the input terminal of the amplifier circuit.

The above-described MOSFET according to the invention further preferably includes both of the above-described p-channel and n-channel MOSFETs.

The above-described MOSFET according to the invention maintains the OFF state. In other words, the drain is electrically separated from the source. Furthermore, extremely high resistances to reverse bias inherently exist both between the drain and the backgate and between the source and the backgate. These high resistances can be fully ensured even if the above-described MOSFETs are embedded on the substrate where the other elements inside the bias circuit and the amplifier circuit are embedded. Furthermore, of the drain and source of the above-described MOSFET, the one is connected to the input terminal of the amplifier circuit and the other is fixed at a constant potential; the potential of the external power supply or the ground potential. Accordingly, when the potential of the backgate is maintained equal to the bias voltage, the potential of the input terminal of the amplifier circuit is maintained substantially equal to the bias voltage. Here, the resistance between the input terminal of the amplifier circuit and the output terminal of the bias voltage generating section is nearly equal to the drain- or source-backgate resistance to reverse bias. Thus, the whole of the above-described bias circuit according to the invention is embedded on the same substrate, on which the amplifier circuit is embedded, with a sufficiently high output impedance maintained.

The above-described MOSFET according to the invention also has a function of protecting the amplifier circuit from ESD as follows. When a surge voltage caused by ESD is applied from the surroundings to the input terminal of the amplifier circuit, the above-described MOSFET is brought into conduction between the drain and the source, thereby connecting the input terminal of the amplifier circuit to the high or low side power supply terminal. Here, the conduction is established by one of the following: a breakdown at a diode (PN junction) parasitic between the drain or source and the backgate; a turn-on of a bipolar transistor parasitic among the drain, the source, and the backgate; and the channel generation between the drain and the source. Because of the drain-source conduction, the surge energy is absorbed into the power supply or the ground conductor. Thus, adverse effects of the surge on the amplifier circuit and the following stages are avoided. In other words, the above-described amplification device according to the invention is resistant to ESD.

In the above-described MOSFET according to the invention, no leak current flows through the input terminal of the amplifier circuit since it has the MOSFET input stage. Accordingly, the drain- or source-backgate PN junction included in the above-described MOSFET is not reverse-biased by the leak current of the amplifier circuit. In the other words, the potential of the input terminal of the amplifier circuit is stably maintained equal to the bias voltage. The bias voltage is stable enough, in particular, even if the above-described PN junctions are provided with reduced areas in order to miniaturization, thereby being provided with higher resistances to reverse bias and further exhibiting a wide range of the resistance variations. Thus, the above-described bias circuit according to the invention maintains both of the high reliability of its ESD protection and the high stability of the bias voltage.

In the amplification device according to the invention, the bias circuit achieves a sufficiently high output impedance, using the above-described MOSFET, as described above. Thereby, the whole of the bias circuit and the amplifier circuit is embedded on the same substrate with the extremely high input impedance, the high ESD tolerance, and the highly stable bias voltage maintained. As a result, the above-described amplification device according to the invention achieves the compatibility between further higher integration and further improvement in high reliability. The above-described amplification device according to the invention is superior especially to other amplification devices connected directly to low-frequency signal sources with high internal impedances such as vibration sensors.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DETAILED DESCRIPTION OF THE INVENTION

The following explains the best embodiments of the present invention, referring to the figures.

Embodiment 1

An amplification device according to Embodiment 1 of the invention is preferably used for the first stage of a multistage amplification device. The amplification device amplifies signals provided from, for example, a miniature vibration sensor. The vibration sensor is preferably of a piezoelectric type, which uses a piezoelectric device. The vibration sensor may alternatively be an ECM. An amplification device 10A according to Embodiment 1 of the invention is connected directly to a piezoelectric device 3. See FIG. 1. This amplification device 10A is preferably a single integrated circuit, which is embedded on a single substrate. The amplification device 10A comprises a high side power supply terminal VDD, a low side power supply terminal GND, an operational amplifier 1, and a bias circuit 2A. The bias circuit 2A includes a bias voltage generating section 2V and an impedance element 2P.

Figure 1:
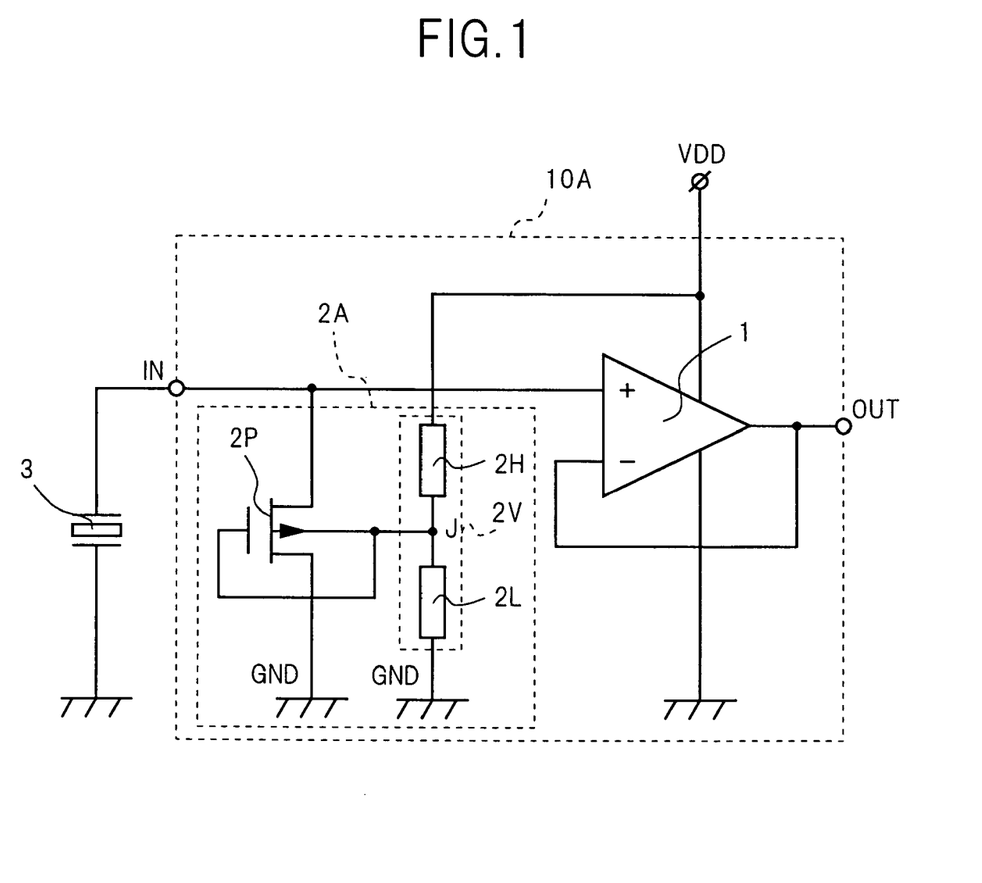
FIG. 1 is an equivalent circuit diagram that shows an amplification device 10A according to Embodiment 1 of the invention.

The high side power supply terminal VDD is connected to an external constant-voltage source (not shown) and maintained at a predetermined high potential, which is hereafter referred to as a line voltage. The low side power supply terminal GND is preferably a ground terminal, which is connected to a predetermined ground conductor. The low side power supply terminal GND may alternatively be maintained at a (particularly, negative) potential different from the ground potential by an external constant-voltage source (not shown). Hereafter, the high and low power supply terminal VDD and GND are referred to as power supply and ground terminals, respectively.

The operational amplifier 1 is an amplifier circuit with MOSFET input stage and an extremely high input impedance. The input terminal IN of the operational amplifier 1 is connected directly to the piezoelectric device 3. Using the line voltage, the operational amplifier 1 amplifies the output signal of the piezoelectric device 3 that is applied to the input terminal IN. The signal amplified is sent to the next-stage amplifier circuit (not shown) through the output terminal OUT. For example, the operational amplifier 1 is of a voltage follower type and functions as a buffer between the piezoelectric device 3 and the next-stage amplifier circuit. In other words, the input terminal IN and the output terminal OUT are at substantially equal potentials. The operational amplifier 1 may alternatively be an amplifier circuit with a gain higher than one.

The bias voltage generating section 2V is preferably a voltage divider including a series connection of two resistance elements 2H and 2L. The series connection is connected between the power supply terminal VDD and the ground terminal GND, or alternatively, may be connected between a high side power supply terminal other than the power supply terminal VDD and a ground terminal or another low side power supply terminal. The potential of the node J between the two resistance elements 2H and 2L, or the potential of the output terminal J of the bias voltage generating section 2V, which is hereafter referred to as a bias voltage, is maintained a predetermined rate lower than the line voltage. The rate is adjusted through the resistance values of the two resistance elements 2H and 2L. For example, the bias voltage is equal to ½ of the line voltage when the two resistance elements 2H and 2L are of the same resistance value. A capacitor may be connected between the output terminal J of the bias voltage generating section 2V and the ground terminal GND or in parallel to the series connection of the two resistance elements 2H and 2L. The capacitor cuts off noises provided from the external power supply. The bias voltage generating section may be a constant-voltage source or the like using a band gap reference etc., instead of the voltage divider 2V.

Figure 2:
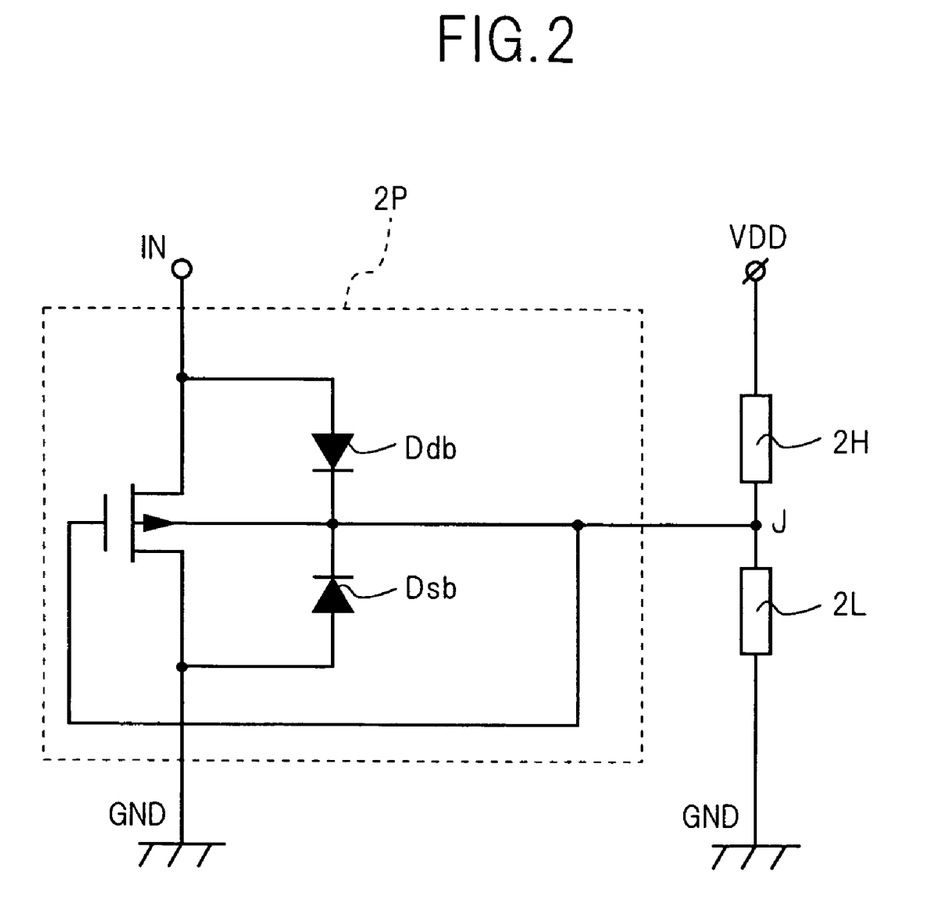
FIG. 2 is an equivalent circuit diagram that shows parasitic diodes Ddb and Dsb of a p-channel MOSFET 2P according to Embodiment 1 of the invention.

The impedance element 2P is a p-channel MOSFET, which is of an enhancement type. The drain and source of the p-channel MOSFET 2P are connected to the input terminals IN of the operational amplifier 1 and the ground terminal GND, respectively. Thereby, the source potential is fixed at the ground potential. The gate and backgate of the p-channel MOSFET 2P are both connected to the output terminal J of the bias voltage generating section 2V. Here, the backgate is electrically separated from the substrate, preferably by a PN junction. In the case of a p-type substrate, for example, the substrate grounded electrically separates the backgate (n-type region) from the p-type substrate. Conversely, in the case of an n-type substrate, the backgate (n-type region) is formed inside a p well on the substrate. The p well left open or grounded electrically separates the backgate from the n-type substrate. Alternatively, the backgate may be electrically separated from the substrate using insulators. Both of the gate and backgate potentials are equal to the bias voltage. Then, the channel generation is prohibited between the drain and the source. In other words, the p-channel MOSFET 2P maintains the OFF state, and accordingly, the drain is electrically separated from the source. Parasitic diodes (PN junctions) Ddb and Dsb exist between the drain and the backgate and between the source and the backgate, respectively. See FIG. 2. Each cathode of the parasitic diodes Ddb and Dsb is connected to the output terminal J of the bias voltage generating section 2V. The source-backgate parasitic diode Dsb is reverse-biased at the voltage equal to the bias voltage. The drain-backgate parasitic diode Ddb clamps the drain potential to the bias voltage. Here, no leak current flows through the input terminal IN of the operational amplifier 1 since it has the MOSFET input stage. Accordingly, the drain-backgate parasitic diode Ddb is not reverse-biased by the leak current of the operational amplifier 1. Thus, the potential of the input terminal IN of the operational amplifier 1, or the bias voltage is maintained with high stability, regardless of variations in ambient temperature. As a result, the amplification device 10A has high reliability.

When the p-channel MOSFET 2P is maintained in the OFF state, its drain-backgate resistance, that is, the current-voltage characteristic of the drain-backgate parasitic diode (PN junction) Ddb, in which the current is expressed by an exponential function of the voltage, depends mainly on the impurity concentration in the drain region (p-type region) and the area of its boundary (PN junction area). For example, when the PN junction area of the drain region is of the order of 100 μm² and almost no reverse bias is applied between the drain and the backgate, the drain-backgate resistance reaches 1,000 GΩ=1 TΩ, which is two or three orders of magnitude higher than the output impedance of the typical, conventional bias circuit (cf. FIG. 7). The p-channel MOSFET 2P is embedded on the same substrate together with the other circuits of the amplification device 10A such as the operational amplifier 1. Thus, the amplification device 10A with an extremely high input impedance is configured as a single integrated circuit. In other words, the amplification device 10A allows high integration to be achieved, in contrast to the conventional devices.

Because of its extremely high input impedance, the amplification device 10A is suitable for use as a direct-coupled amplifier for not only the piezoelectric device 3 but also general signal sources with high internal impedances. Since the piezoelectric device 3, in particular, has higher internal impedances at lower output frequencies, the amplification device 10A can amplify the lower frequency components of the output signal of the piezoelectric device 3 than the conventional device. Thus, the amplification device 10A is excellent for use as an amplifier connected directly to, in particular, a low-frequency signal source such as a vibration sensor.

The p-channel MOSFET 2P further protects the operational amplifier 1 from ESD surges. When the potential of the input terminal IN abruptly rises from the bias voltage by an ESD, the forward current flows in the drain-backgate parasitic diode Ddb. See FIG. 2. Thereby, a PNP bipolar transistor parasitic among the drain (p-type region), the source (p-type region), and the backgate (n-type region) is turned on, accordingly grounding the input terminal IN. Conversely, when the potential of the input terminal IN abruptly drops far below the bias voltage, the drain-backgate parasitic diode Ddb causes a breakdown in the p-channel MOSFET 2P. See FIG. 2. Thereby, the input terminal IN is grounded through the p-channel MOSFET 2P. Thus, the surge energy is absorbed into the ground conductor regardless of the polarity of the surge, and therefore, adverse effects of the surges on the operational amplifier 1 and further the following stages are avoided. In other words, the amplification device 10A is resistant to the ESD surges.

The source is grounded in the above-described p-channel MOSFET 2P. However, MOSFETs in general have a drain and a source symmetric in structure. Accordingly, no essential difference exists between the drain and the source in a setting where the backgate potential is different from the source potential, as described above. Therefore, the drain and the source may be exchanged with each other in the p-channel MOSFET 2P.

Embodiment 2

Figure 3:
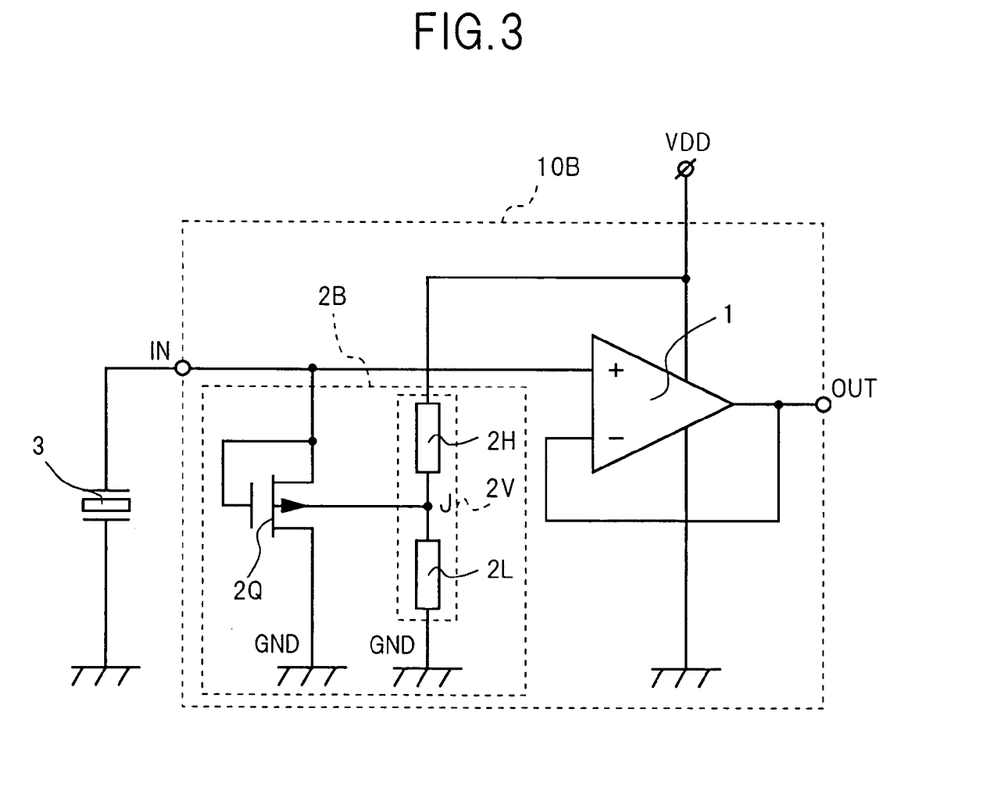
FIG. 3 is an equivalent circuit diagram that shows an amplification device 10B according to Embodiment 2 of the invention.

The amplification device 10B according to Embodiment 2 of the invention is connected directly to the piezoelectric device 3, similarly to the amplification device 10A according to Embodiment 1. See FIG. 3. This amplification device 10B is preferably a single integrated circuit, which is embedded on a single substrate. The amplification device 10B comprises a configuration in common with the amplification device 10A according to Embodiment 1, except for the configuration of a bias circuit 2B. In FIG. 3, the components similar to the components shown in FIG. 1 are marked with the same reference symbols as the reference symbols shown in FIG. 1. Furthermore, for the details of the similar components, the explanation about Embodiment 1 is cited.

The bias circuit 2B includes a p-channel MOSFET 2Q for use as an impedance element, similarly to the bias circuit 2A according to Embodiment 1. However, the gate of the p-channel MOSFET 2Q is connected to the drain, in contrast to the p-channel MOSFET 2P according to Embodiment 1. See FIG. 3. As for the other configurations, the p-channel MOSFET 2Q is similar to the p-channel MOSFET 2P according to Embodiment 1. In the p-channel MOSFET 2Q, the source potential is fixed at the ground potential, the drain and gate potentials are the same, and the backgate potential is equal to the bias voltage. The source-backgate parasitic diode is reverse-biased at the voltage equal to the bias voltage. The drain-backgate parasitic diode clamps the drain potential to the bias voltage. Accordingly, the potential of the input terminal IN of the operational amplifier 1 is maintained equal to the bias voltage. Furthermore, the gate potential is equal to the bias voltage. Thereby, the p-channel MOSFET 2Q maintains the OFF state, and thus the drain is electrically separated from the source. Here, the gate potential varies in response to the output signals of the piezoelectric device 3. However, the levels of the output signals of the piezoelectric device 3 are extremely low, usually 10 mV or less, when compared with the threshold voltage of the p-channel MOSFET 2Q. Therefore, there is very little danger that the variations of the gate potential changes the OFF state of the p-channel MOSFET 2Q.

When the p-channel MOSFET 2Q is maintained in the OFF state and almost no reverse bias is applied between the drain and the backgate, the drain-backgate resistance is much higher than the output impedance of the typical, conventional bias circuit (cf. FIG. 7), similarly to the p-channel MOSFET 2P according to Embodiment 1. The p-channel MOSFET 2Q is embedded on the same substrate together with the other circuits of the amplification device 10B. Thus, the amplification device 10B with an extremely high input impedance is configured as a single integrated circuit. In other words, the amplification device 10B allows high integration to be achieved, in contrast to the conventional devices. Furthermore, the amplification device 10B has high stability of the bias voltage, and therefore, has high reliability, similarly to the amplification device 10A according to Embodiment 1. Thus, the amplification device 10B is excellent for use as a direct-coupled amplifier for general signal sources with high internal impedances, in particular, low-frequency signal sources such as vibration sensors.

The p-channel MOSFET 2Q has the function of protecting the operational amplifier 1 from the ESD surges, similarly to the p-channel MOSFET 2P according to Embodiment 1. In the p-channel MOSFET 2Q, however, the surge voltage can cause the gate potential to vary together with the drain potential, in contrast to the p-channel MOSFET 2P according to Embodiment 1. Accordingly, the ESD protection function of the p-channel MOSFET 2Q slightly differs from the ESD protection function of the p-channel MOSFET 2P according to Embodiment 1. When the potential of the input terminal IN abruptly rises from the bias voltage by an ESD, the forward current flows in the drain-backgate parasitic diode. Thereby, a PNP bipolar transistor parasitic among the drain, the source, and the backgate is turned on, then grounding the input terminal IN. Conversely, when the potential of the input terminal IN abruptly drops below the ground voltage and thereby the gate-source potential difference exceeds the threshold voltage, the channel is generated between the drain and the source in the p-channel MOSFET 2Q. In other words, the p-channel MOSFET 2Q is turned on, thereby grounding the input terminal IN. Thus, the surge energy is absorbed into the ground conductor regardless of the polarity of the surge, and therefore, adverse effects of the surge on the operational amplifier 1 and further the following stages are avoided. In other words, the amplification device 10B is resistant to the ESD surges.

The source is grounded in the p-channel MOSFET 2Q. However, the drain and the source may be exchanged with each other, similarly to those of the p-channel MOSFET 2P according to Embodiment 1.

Embodiment 3

Figure 4:
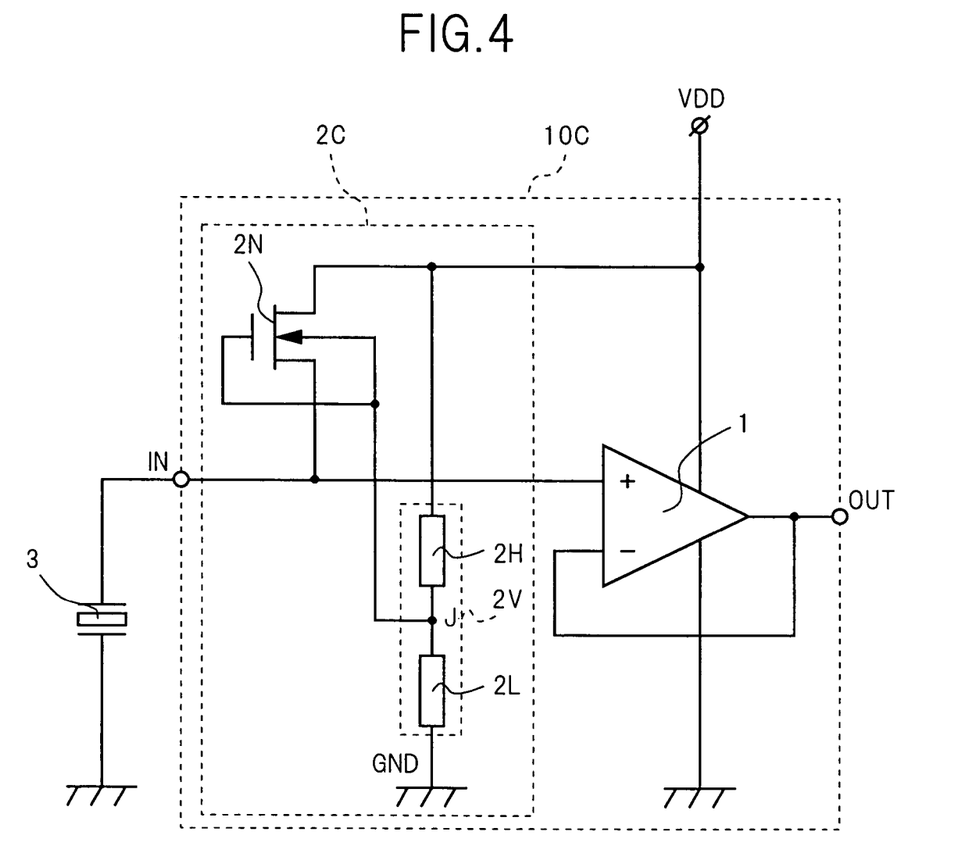
FIG. 4 is an equivalent circuit diagram that shows an amplification device 10C according to Embodiment 3 of the invention.

The amplification device 10C according to Embodiment 3 of the invention is connected directly to the piezoelectric device 3, similarly to the amplification device 10A according to Embodiment 1. See FIG. 4. This amplification device 10C is preferably a single integrated circuit, which is embedded on a single substrate. The amplification device 10C comprises a configuration in common with the amplification device 10A according to Embodiment 1, except for the configuration of a bias circuit 2C. In FIG. 4, the components similar to the components shown in FIG. 1 are marked with the same reference symbols as the reference symbols shown in FIG. 1. Furthermore, for the details of the similar components, the explanation about Embodiment 1 is cited.

The bias circuit 2C includes an n-channel MOSFET 2N for use as an impedance element, instead of the p-channel MOSFET 2P, in contrast to the bias circuit 2A according to Embodiment 1. The n-channel MOSFET 2N is of an enhancement type. The drain and source of the n-channel MOSFET 2N are connected to the input terminal IN of the operational amplifier 1 and the power supply terminal VDD, respectively. Thereby, the source potential is fixed at the line voltage. The gate and backgate of the n-channel MOSFET 2N are both connected to the output terminal J of the bias voltage generating section 2V, or the node J between the two resistance elements 2H and 2L. Here, the backgate is electrically separated from the substrate, preferably by a PN junction. In the case of an n-type substrate, for example, the substrate potential fixed at the line voltage electrically separates the backgate (p-type region) from the n-type substrate. Conversely, in the case of a p-type substrate, the backgate (p-type region) is formed inside an n well on the substrate. The n well potential left open or fixed at the line voltage electrically separates the backgate from the n-type substrate. Alternatively, the backgate may be electrically separated from the substrate using insulators. Both of the gate and backgate potentials are equal to the bias voltage. Then, the channel generation is prohibited between the drain and the source. In other words, the n-channel MOSFET 2N maintains the OFF state, and accordingly, the drain is electrically separated from the source. Parasitic diodes (PN junctions) exist between the drain and the backgate and between the source and the backgate, respectively. However, each anode of the parasitic diodes is connected to the output terminal J of the bias voltage generating section 2V, in contrast to the p-channel MOSFET 2P according to Embodiment 1. The source-backgate parasitic diode is reverse-biased at a voltage equal to the difference between the line and bias voltages. The drain-backgate parasitic diode clamps the drain potential to the bias voltage. Here, no leak current flows through the input terminal IN of the operational amplifier 1 since it has the MOSFET input stage. Accordingly, the drain-backgate parasitic diode is not reverse-biased by the leak current of the operational amplifier 1. Thus, the potential of the input terminal IN of the operational amplifier 1, or the bias voltage is maintained with high stability, regardless of variations in ambient temperature. As a result, the amplification device 10C has high reliability.

When the n-channel MOSFET 2N is maintained in the OFF state, its drain-backgate resistance is much higher than the output impedance of the typical, conventional bias circuit (cf. FIG. 7), similarly to the p-channel MOSFET 2P according to Embodiment 1. The n-channel MOSFET 2N is embedded on the same substrate together with the other circuits of the amplification device 10C such as the operational amplifier 1. Thus, the amplification device 10C with an extremely high input impedance is configured as a single integrated circuit. In other words, the amplification device 10C allows high integration to be achieved, in contrast to the conventional devices. Therefore, the amplification device 10C is excellent for use as a direct-coupled amplifier for general signal sources with high internal impedances, in particular, low-frequency signal sources such as vibration sensors.

The n-channel MOSFET 2N further protects the operational amplifier 1 from ESD surges. When the potential of the input terminal IN abruptly drops below the bias voltage by an ESD, the forward current flows in the drain-backgate parasitic diode. Thereby, an NPN bipolar transistor parasitic among the drain (n-type region), the source (n-type region), and the backgate (p-type region) is turned on, accordingly connecting the input terminal IN to the power supply terminal VDD. Conversely, when the potential of the input terminal IN abruptly and highly rises from the bias voltage, the drain-backgate parasitic diode causes a breakdown in the n-channel MOSFET 2N. Thereby, the input terminal IN is connected to the power supply terminal VDD through the n-channel MOSFET 2N. Thus, the surge energy is absorbed into an external power supply through the power supply terminal VDD regardless of the polarity of the surge, and therefore, adverse effects of the surges on the operational amplifier 1 and further the following stages are avoided. In other words, the amplification device 10C is resistant to the ESD surges.

The source is connected to the power supply terminal VDD in the above-described n-channel MOSFET 2N. However, the drain and the source may be exchanged with each other, similarly to those of the p-channel MOSFET 2P according to Embodiment 1.

Embodiment 4

Figure 5:
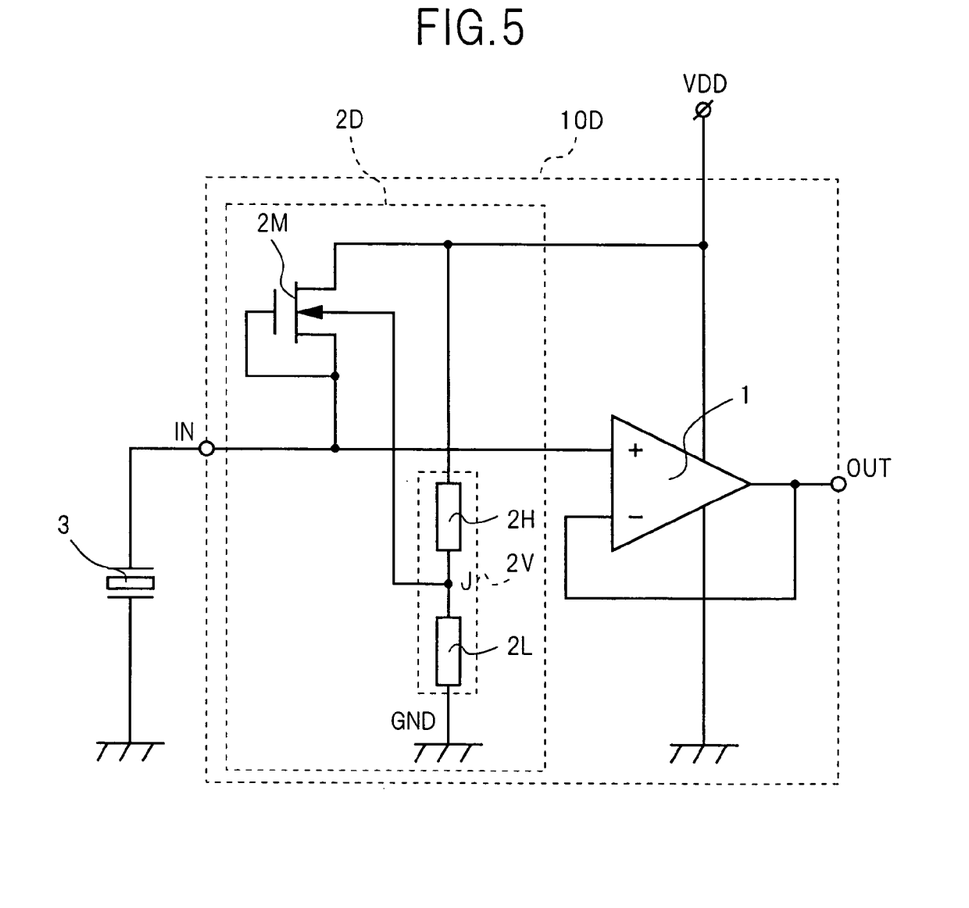
FIG. 5 is an equivalent circuit diagram that shows an amplification device 10D according to Embodiment 4 of the invention.

The amplification device 10D according to Embodiment 4 of the invention is connected directly to the piezoelectric device 3, similarly to the amplification device 10A according to Embodiment 1. See FIG. 5. This amplification device 10D is preferably a single integrated circuit, which is embedded on a single substrate. The amplification device 10D comprises a configuration in common with the amplification device 10A according to Embodiment 1, except for the configuration of a bias circuit 2D. In FIG. 5, the components similar to the components shown in FIG. 1 are marked with the same reference symbols as the reference symbols shown in FIG. 1. Furthermore, for the details of the similar components, the explanation about Embodiment 1 is cited.

The bias circuit 2D includes an n-channel MOSFET 2M for use as an impedance element, similarly to the bias circuit 2C according to Embodiment 3. However, the gate of the n-channel MOSFET 2M is connected to the drain, in contrast to the n-channel MOSFET 2N according to Embodiment 3. See FIG. 5. As for the other configurations, the n-channel MOSFET 2M is similar to the n-channel MOSFET 2N according to Embodiment 3. In the n-channel MOSFET 2M, the source potential is fixed at the line voltage, the drain and gate potentials are the same, and the backgate potential is equal to the bias voltage. The source-backgate parasitic diode is reverse-biased at the voltage equal to the difference between the line and bias voltages. The drain-backgate parasitic diode clamps the drain potential to the bias voltage. Accordingly, the potential of the input terminal IN of the operational amplifier 1 is maintained equal to the bias voltage. Furthermore, the gate potential is equal to the bias voltage. Thereby, the n-channel MOSFET 2M maintains the OFF state, and thus the drain is electrically separated from the source. Here, the levels of the output signals of the piezoelectric device 3 are extremely low when compared with the threshold voltage of the n-channel MOSFET 2M. Therefore, there is very little danger that the variations of the gate potential changes the OFF state of the n-channel MOSFET 2M.

When the n-channel MOSFET 2M is maintained in the OFF state and almost no reverse bias is applied between the drain and the backgate, the drain-backgate resistance is much higher than the output impedance of the typical, conventional bias circuit (cf. FIG. 7), similarly to the n-channel MOSFET 2N according to Embodiment 3. The n-channel MOSFET 2M is embedded on the same substrate together with the other circuits of the amplification device 10D. Thus, the amplification device 10D with an extremely high input impedance is configured as a single integrated circuit. In other words, the amplification device 10D allows high integration to be achieved, in contrast to the conventional devices. Furthermore, the amplification device 10D has high stability of the bias voltage, and accordingly, has high reliability, similarly to the amplification device 10C according to Embodiment 3. Therefore, the amplification device 10D is excellent for use as a direct-coupled amplifier for general signal sources with high internal impedances, in particular, low-frequency signal sources such as vibration sensors.

The n-channel MOSFET 2M has the function of protecting the operational amplifier 1 from the ESD surges, similarly to the n-channel MOSFET 2N according to Embodiment 3. In the n-channel MOSFET 2M, however, the surge voltage can cause the gate potential to vary together with the drain potential, in contrast to the n-channel MOSFET 2N according to Embodiment 3. Accordingly, the ESD protection function of the n-channel MOSFET 2M slightly differs from the ESD protection function of the n-channel MOSFET 2N according to Embodiment 3. When the potential of the input terminal IN abruptly drops below the bias voltage by an ESD, the forward current flows in the drain-backgate parasitic diode. Thereby, an NPN bipolar transistor parasitic among the drain, the source, and the backgate is turned on, then connecting the input terminal IN to the power supply terminal VDD. Conversely, when the potential of the input terminal IN abruptly rises beyond the line voltage and thereby the gate-source potential difference exceeds the threshold voltage, the channel is generated between the drain and source in the n-channel MOSFET 2M. In other words, the n-channel MOSFET 2M is turned on, thereby connecting the input terminal IN to the power supply terminal VDD. Thus, the surge energy is absorbed into the external power supply regardless of the polarity of the surge, and therefore, adverse effects of the surge on the operational amplifier 1 and further the following stages are avoided. In other words, the amplification device 10D is resistant to the ESD surges.

The source is connected to the power supply terminal VDD in the n-channel MOSFET 2M. However, the drain and the source may be exchanged with each other, similarly to those of the p-channel MOSFET 2P according to Embodiment 1.

Embodiment 5

Figure 6:
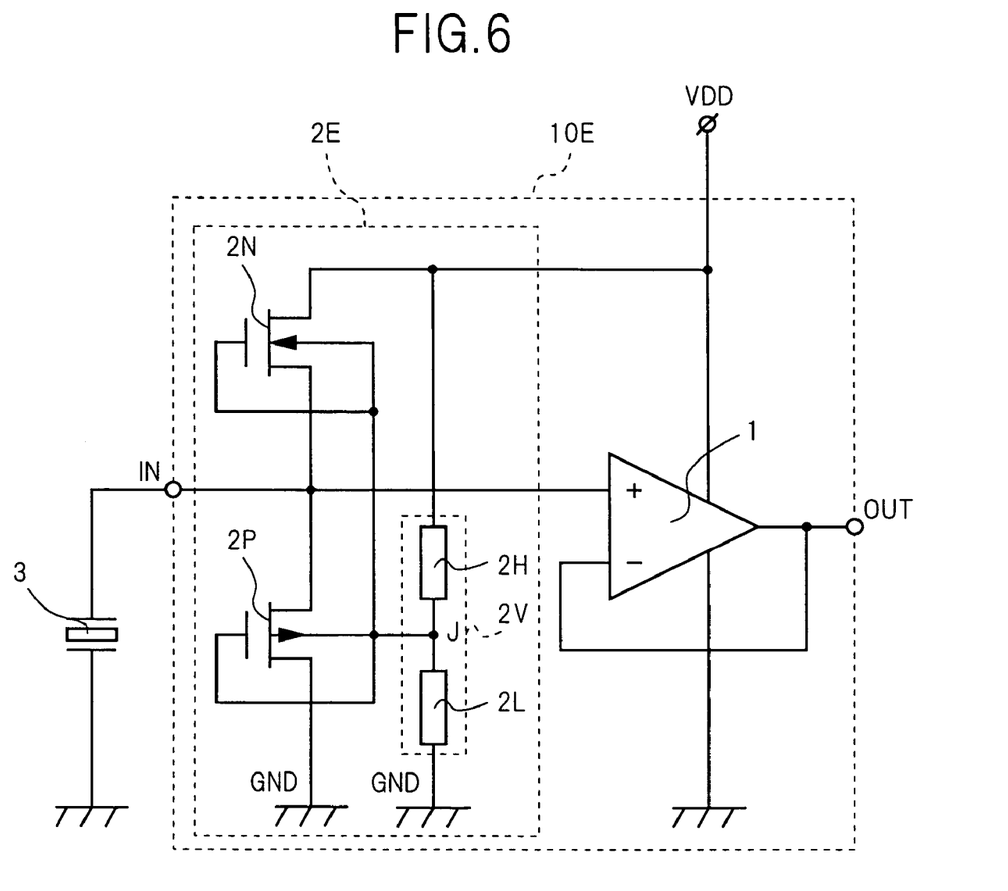
FIG. 6 is an equivalent circuit diagram that shows an amplification device 10E according to Embodiment 5 of the invention.

The amplification device 10E according to Embodiment 5 of the invention is connected directly to the piezoelectric device 3, similarly to the amplification device 10A according to Embodiment 1. See FIG. 6. This amplification device 10E is preferably a single integrated circuit, which is embedded on a single substrate. The amplification device 10E comprises a configuration in common with the amplification device 10A according to Embodiment 1, except for the configuration of a bias circuit 2E. In FIG. 6, the components similar to the components shown in FIGS. 1 and 4 are marked with the same reference symbols as the reference symbols shown in FIGS. 1 and 4. Furthermore, for the details of the similar components, the explanation about Embodiments 1 and 3 is cited.

The bias circuit 2E includes both of a p-channel MOSFET 2P and an n-channel MOSFET 2N for use as impedance elements, in addition to the bias voltage generating section 2V. See FIG. 6. The p-channel MOSFET 2P is quite similar in configuration and function to the p-channel MOSFET 2P according to Embodiment 1 (cf. FIG. 1). The n-channel MOSFET 2N is quite similar in configuration and function to the n-channel MOSFET 2N according to Embodiment 3 (cf. FIG. 4). Accordingly, the amplification device 10E with an extremely high input impedance is configured as a single integrated circuit, similarly to the amplification devices 10A and 10C according to Embodiments 1 and 3. In other words, the amplification device 10E allows high integration to be achieved, thus being excellent for use as a direct-coupled amplifier for general signal sources with high internal impedances, in particular, low-frequency signal sources such as vibration sensors.

The two MOSFETs 2P and 2N further protect the operational amplifier 1 from ESD surges, similarly to the MOSFETs 2P and 2N according to Embodiments 1 and 3. In other words, the surge energy is absorbed into the ground conductor or the external power supply through the MOSFETs 2P and 2N. Thereby, adverse effects of the surges on the operational amplifier 1 and further the following stages are avoided. In other words, the amplification device 10E is resistant to the ESD surges.

The sources of the two MOSFETs 2P and 2N are connected to the ground terminal GND and the power supply terminal VDD, respectively. However, the drain and the source may be exchanged with each other, similarly to those of the MOSFETs 2P and 2N according to Embodiments 1 and 3. In addition, the p-channel MOSFET 2Q according to Embodiment 2 may be used instead of the p-channel MOSFET 2P. Similarly, the n-channel MOSFET 2M according to Embodiment 4 may be used instead of the n-channel MOSFET 2N.

The above-described disclosure of the invention in terms of the presently preferred embodiments is not to be interpreted as intended for limiting. Various alterations and modifications will no doubt become apparent to those skilled in the art to which the invention pertains, after having read the disclosure. As a corollary to that, such alterations and modifications apparently fall within the true spirit and scope of the invention. Furthermore, it is to be understood that the appended claims be intended as covering the alterations and modifications.

The amplification device according to the invention amplifies the output signal of a signal source with a high internal impedance, in particular. The amplification device uses a MOSFET as an impedance element, as described above. As such, the invention obviously has industrial applicability.

The invention claimed is:

1. An amplifier comprising:
a substrate;
a high side power supply terminal connected to an external constant-voltage source and maintained at a fixed high potential;
a low side power supply terminal connected to one of an external constant-voltage source and a ground conductor, and maintained at a fixed low potential;
an amplifier circuit with a MOSFET input stage that includes an input terminal connected to an external signal source, is embedded on said substrate, receives a signal of said signal source through said input terminal, and amplifies the signal at a predetermined rate; and
a bias circuit embedded on said substrate and comprising:
a bias voltage generating section that generates a predetermined bias voltage; and
a MOSFET acting as an impedance device including
a drain and a source, the one of which is connected to one of said high and low side power supply terminals, and the other is connected to the input terminal of said amplifier circuit,
a gate maintained at the potential to prohibit the channel generation between said drain and said source, and
a backgate electrically separated from said substrate and maintained at the potential equal to said bias voltage.

2. The amplifier according to claim 1 wherein:
said MOSFET includes a p-channel MOSFET;
said drain and source are the drain and source of said p-channel MOSFET and are connected to the input terminal of said amplifier circuit and said low side power supply terminal, respectively; and
said gate is the gate of said p-channel MOSFET and is connected to said bias voltage generating section.

3. The amplifier according to claim 1 wherein:
said MOSFET includes a p-channel MOSFET;
said drain and source are the drain and source of said p-channel MOSFET and are connected to the input terminal of said amplifier circuit and said low side power supply terminal, respectively; and
said gate is the gate of said p-channel MOSFET and is connected to the input terminal of said amplifier circuit.

4. The amplifier according to claim 1 wherein:
said MOSFET includes an n-channel MOSFET;
said drain and source are the drain and source of said n-channel MOSFET and are connected to the input terminal of said amplifier circuit and said high side power supply terminal, respectively; and
said gate is the gate of said n-channel MOSFET and is connected to said bias voltage generating section.

5. The amplifier according to claim 1 wherein:
said MOSFET includes an n-channel MOSFET;
said drain and source are the drain and source of said n-channel MOSFET and are connected to the input terminal of said amplifier circuit and said high side power supply terminal, respectively; and
said gate is the gate of said n-channel MOSFET and is connected to the input terminal of said amplifier circuit.

* * * * *